United States Patent
Iwasaki

(10) Patent No.: US 10,269,910 B2
(45) Date of Patent: Apr. 23, 2019

(54) SEMICONDUCTOR DEVICE AND METHOD OF MANUFACTURING THE SAME

(71) Applicant: TOYOTA JIDOSHA KABUSHIKI KAISHA, Toyota-shi, Aichi (JP)

(72) Inventor: Shinya Iwasaki, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/621,169

(22) Filed: Jun. 13, 2017

(65) Prior Publication Data

US 2018/0047821 A1     Feb. 15, 2018

(30) Foreign Application Priority Data

Aug. 12, 2016 (JP) .................................. 2016-158953

(51) Int. Cl.
| | |
|---|---|
| *H01L 29/66* | (2006.01) |
| *H01L 29/423* | (2006.01) |
| *H01L 29/78* | (2006.01) |
| *H01L 29/739* | (2006.01) |

(52) U.S. Cl.
CPC .... *H01L 29/4236* (2013.01); *H01L 29/66348* (2013.01); *H01L 29/66666* (2013.01); *H01L 29/7397* (2013.01); *H01L 29/7827* (2013.01)

(58) Field of Classification Search
CPC ......... H01L 29/66348; H01L 29/66666; H01L 29/7397
USPC ......................... 257/139, 330, 331, 332, 333
See application file for complete search history.

(56) References Cited

U.S. PATENT DOCUMENTS

| | | | | |
|---|---|---|---|---|
| 7,741,676 B2* | 6/2010 | Hashimoto | ....... | H01L 29/66727 257/330 |
| 2011/0062514 A1 | 3/2011 | Takano | | |
| 2015/0179758 A1 | 6/2015 | Ata | | |
| 2016/0211361 A1 | 7/2016 | Nishimura | | |

FOREIGN PATENT DOCUMENTS

| | | |
|---|---|---|
| JP | 2009-295778 A | 12/2009 |
| JP | 2011-066121 A | 3/2011 |
| JP | 2014-187197 A | 10/2014 |
| JP | 2016-134387 A | 7/2016 |
| WO | 2014/013618 A1 | 1/2014 |

* cited by examiner

*Primary Examiner* — Tan N Tran
(74) *Attorney, Agent, or Firm* — Oliff PLC

(57) ABSTRACT

A method of manufacturing a semiconductor device, the method comprising: forming trenches in an upper surface of a semiconductor substrate, the semiconductor substrate comprising a first region and a second region, the trenches in the first region having a wide width, and the trenches in the second region having a narrow width; forming insulating films on inner surfaces of the trenches; filling conductive material inside the trenches; etching the conductive material until each of upper surfaces of the conductive material filled inside the trenches becomes lower than the upper surface of the semiconductor substrate; and forming, after the etching of the conductive material, an impurity layer by implanting impurities to a predetermined depth range, the impurity layer having a concentration by which a conductivity type of a region opposed to the conductive material via each insulating film is inverted by a potential applied to the conductive material.

8 Claims, 14 Drawing Sheets

SEMICONDUCTOR DEVICE AND METHOD OF MANUFACTURING THE SAME

TECHNICAL FIELD

The present teachings disclose a semiconductor device and a method for manufacturing the same.

BACKGROUND ART

International Publication No. WO 2014-013618 discloses a semiconductor device in which a main region and a sense region are provided in a common semiconductor substrate. In the semiconductor device, by making area(s) of an emitter region and/or a body contact region that constitutes a semiconductor structure provided in the main region different from area(s) of an emitter region and/or a body contact region provided in the sense region, a threshold voltage in the main region is made lower than a threshold voltage in the sense region.

SUMMARY

In the conventional art, a group of semiconductor structures having different threshold voltages is formed in the common semiconductor substrate by changing the area(s) of its emitter region and/or its body contact region. Various circumstances may make it difficult to change the area(s) of the emitter region and/or the body contact region. The present inventors considered a technique for forming a group of semiconductor structures having different threshold voltages in a common semiconductor substrate by a new technique different from the above technique.

The present teachings disclose a novel method for manufacturing a semiconductor device in which a group of semiconductor structures having different threshold voltages is formed in a common semiconductor substrate, and the semiconductor device.

Disclosed herein is a method of manufacturing a semiconductor device in which a group of semiconductor structures having different threshold voltages is formed in a common semiconductor substrate. The method may comprise: forming trenches in an upper surface of a semiconductor substrate, the semiconductor substrate comprising a first region and a second region, the trenches extending from the upper surface to a deep side of the semiconductor substrate, the trenches in the first region having a first width, and the trenches in the second region having a second width that is narrower than the first width; forming insulating films on inner surfaces of the trenches in the first and second regions; filling conductive material inside the trenches in the first and second regions of which the inner surfaces are covered with the insulating films; etching the conductive material from an upper surface side of the semiconductor substrate such that each of upper surfaces of the conductive material filled inside the trenches in the first and second regions becomes lower than the upper surface of the semiconductor substrate; and forming, after the etching of the conductive material, an impurity layer (so-called, the emitter layer and/or the body contact layer) by implanting impurities from the upper surface of the semiconductor substrate to a predetermined depth range, the impurity layer having an impurity concentration such that a conductivity type of the impurity layer is inverted at least in a region opposed to the conductive material via each insulating film when a potential is applied to the conductive material. It should be noted that the upper surfaces of the conductive material in the trenches may be covered with insulating films when the impurities implantation step is implemented.

According to a general-purpose etching, an etching rate of a conductive material filled in a wide trench is higher than the etching rate of the conductive material filled in a narrow trench. According to the above-described manufacturing method, therefore, at the end of the etching, a relationship has been established where a distance between the upper surface of the conductive material in each wide trench and the upper surface of the semiconductor substrate is long whereas a distance between the upper surface of the conductive material in each narrow trench and the upper surface of the semiconductor substrate is short. Impurities are to be implanted under such a relationship. In this case, an impurity concentration in a region opposed to a side surface of each wide trench is low, and an impurity concentration in a region opposed to a side surface of each narrow trench is high. Accordingly, the threshold voltage of the semiconductor structure utilizing the wide trenches is low whereas the threshold voltage of the semiconductor structure utilizing the narrow trenches is high.

According to the above-described manufacturing method, even when it is difficult to change the area(s) of the emitter region and/or the body contact region, a group of semiconductor structures having different threshold voltages can be formed in a common semiconductor substrate. It should be noted that this method is useful not only when it is difficult to change the area(s) of the emitter region and/or the body contact region, but also when the method is carried out instead of or in addition to changing the area(s) of the emitter region and/or the body contact region.

According to the present manufacturing method, it is possible to manufacture a semiconductor device in which the threshold voltage in the main region is lower than the threshold voltage in the sense region. For this purpose, the first region may include the main region, the second region may include the sense region, the conductive material may be filled such that the upper surface of the conductive material becomes higher than the upper surface of the semiconductor substrate, and then the upper surfaces of the conductive material may be etched.

The conductive material remaining inside of each trench simply needs to remain in a depth range where a channel is to be formed, and it is not necessary to fill the conductive material up to an upper end of each trench. Therefore, it is not necessary to fill up the conductive material to the upper ends of the trenches in the filling, and filling may be completed while the upper surface of the conductive material is positioned closer to the deep side than the upper surface of the semiconductor substrate is, and thereafter etching may be performed. Also in this way, the distance between the upper surface of the conductive material and the upper surface of the semiconductor substrate can be made long in the wide trenches whereas the distance between the upper surfaces of the conductive material and the upper surface of the semiconductor substrate can be made short in the narrow trenches, and the threshold voltages can be thus distinct from each other between the former and the latter.

However, when semiconductor devices with stable performances are mass-produced, the conductive material filled inside the trenches may be filled until each of the upper surfaces of the conductive material in the trenches becomes higher than the upper surface of the semiconductor substrate, and thereafter the conductive material filled in the trenches is etched until each of the upper surfaces of the conductive material becomes lower toward the deep side than the upper surface of the semiconductor substrate.

According to the technique disclosed herein, a novel semiconductor device in which a first region having a first threshold voltage and a second region having a second threshold voltage that is higher than the first threshold voltage are formed in a common semiconductor substrate can be obtained. Each of the first region and the second region of the semiconductor device comprises the following configurations:

a first semiconductor region of a first conductivity type provided at a position exposed on an upper surface of the semiconductor substrate; and a second semiconductor layer of a second conductivity type provided on a deep side of the first semiconductor region and being in contact with the first semiconductor region; a third semiconductor layer of the first conductivity type provided on the deep side of the second semiconductor layer, and separated from the first semiconductor region by the second semiconductor layer; and trenches extending from the upper surface of the semiconductor substrate to reach the third semiconductor layer through the first semiconductor region and the second semiconductor layer. The inner surface of each of the trenches is covered with an insulating film, and a conductive material is disposed inside the trench of which inner surface is covered with the insulating film. The conductive material in each trench is insulated from the semiconductor substrate by the corresponding insulating film, and serves as a gate electrode.

In a plan view of the semiconductor substrate, the trenches provided in the first region have a first width, and the trenches provided in the second region have a second width that is narrower than the first width. Further, the upper surfaces of the conductive material in the first region are positioned closer to the deep side of the semiconductor substrate than upper surfaces of the conductive material in the second region are. The second semiconductor layer and the third semiconductor layer may be in direct contact with each other, or another layer may be intervened therebetween.

According to the configurations of the semiconductor device described above, it is possible to obtain a semiconductor device in which the first region includes the main region, the second region includes the sense region, and the threshold voltage of the main region is lower than the threshold voltage of the sense region. When the above-described semiconductor device is manufactured by a general-purpose manufacturing method, each of the upper surfaces of the conductive material in the trenches is shifted toward the deep side from the upper surface of the semiconductor substrate. When the impurities are implanted in a predetermined depth range in this configuration, a peak depth of the impurity concentration (depth at which the concentration becomes highest) shifts toward the deep side of the semiconductor substrate with a closer distance to each trench. In this case, the upper surfaces of the conductive material in the wide trenches shifts at a great degree from the upper surface toward the deep side of the semiconductor substrate whereas the upper surfaces of the conductive material in the narrow trenches shifts at a small degree toward the deep side from the upper surface of the semiconductor substrate. Reflecting this, the peak depth shifts at a great degree in a vicinity of each of the wide trenches with a closer distance to the trench whereas the peak depth shifts at a small degree in a vicinity of each of the narrow trenches with a closer distance to the trench. That is, the peak depth of the impurity concentration of the second conductivity type shifts toward the deep side of the semiconductor substrate with a closer distance to each trench, and a shift amount of the peak depth in the first region is larger than a shift amount of the peak depth in the second region. According to this configuration, the threshold voltage in the main region utilizing the wide trenches is low and the threshold voltage in the sense region utilizing the narrow trenches is high.

The technique described herein can be applied to both an n-channel semiconductor device and a p-channel semiconductor device. The threshold voltage is positive in the n-channel semiconductor device whereas the threshold voltage is negative in the p-channel semiconductor device. In the latter case, an expression "the threshold voltage is low" means that an absolute value of the negative threshold voltage is small.

DETAILED DESCRIPTION

Some of the main features of embodiments to be described below will be first summarized.
(Feature 1) In a plan view of a semiconductor substrate, a contour shape of an emitter region in a main region may be identical to a contour shape of an emitter region in a sense region.
(Feature 2) In the plan view of the semiconductor substrate, a contour shape of a body contact region in the main region may be identical to a contour shape of a body contact region in the sense region.
(Feature 3) A semiconductor device may be a vertical trench gate type IGBT (abbreviation of Insulated Gate Bipolar Transistor).
(Feature 4) The semiconductor device may be a vertical trench gate type FET (abbreviation of Field Effect Transistor).
(Feature 5) In a cross sectional view of the semiconductor substrate, each of an emitter region depth, a drift layer depth, a buffer layer depth, and a collector layer depth may be equal between in the main region and in the sense region.
(Feature 6) A second semiconductor layer (body layer) may be in contact with a third semiconductor layer (drift layer).
(Feature 7) A carrier accumulation layer and a second body layer may be intervened between the second semiconductor layer (first body layer) and the third semiconductor layer (drift layer).

Embodiments

Figure 1:
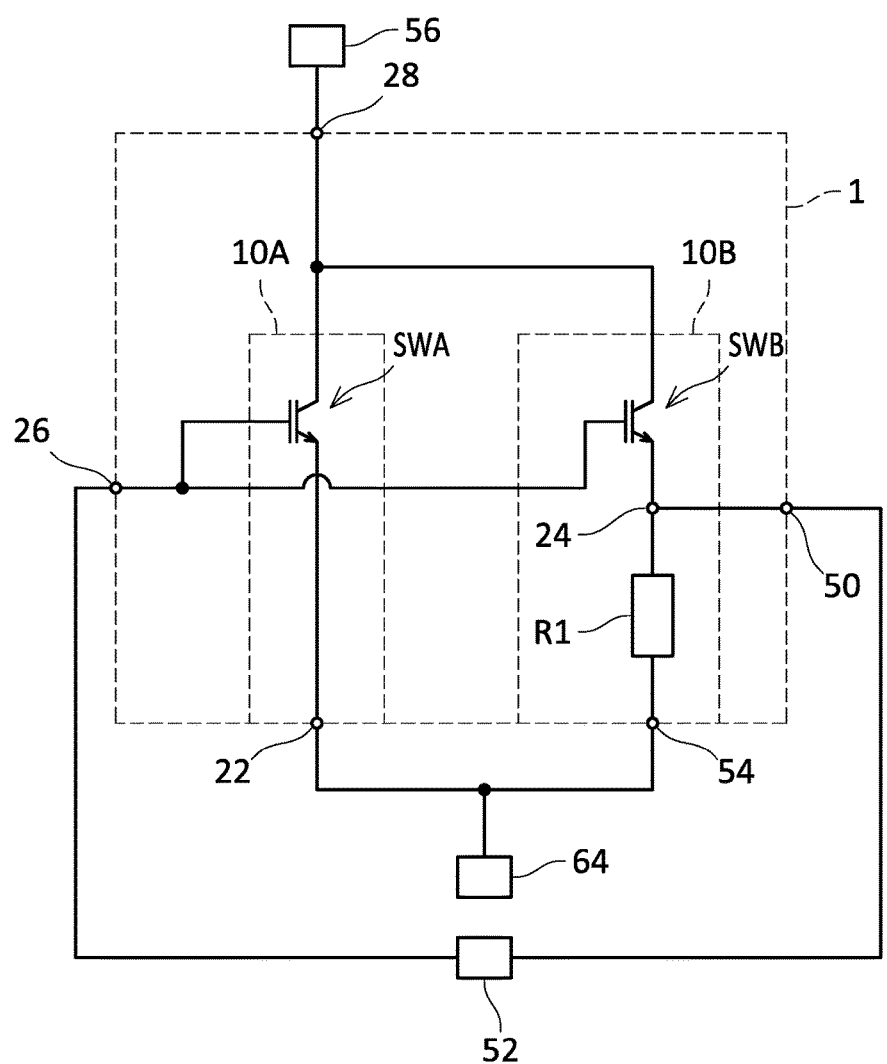
FIG. 1 is a circuit diagram of a semiconductor device of an embodiment.

FIG. 1 schematically shows a circuit diagram of a semiconductor device 1 according to an embodiment. The semiconductor device 1 comprises a main emitter electrode 22, a sense upper surface electrode 54, a sense emitter electrode 24, a collector electrode 28, a gate pad 26, and a current value output pad 50. The main emitter electrode 22 and the collector electrode 28 are a pair of main primary electrodes, and a main switching element SWA (IGBT in this embodiment) is intervened between the main emitter electrode 22 and the collector electrode 28. The sense upper surface electrode 54 and the collector electrode 28 are a pair of sense primary electrodes, and a sense switching element SWB (IGBT in this embodiment) is intervened between the sense upper surface electrode 54 and the collector electrode 28. A current detection resistor R1 is intervened between the sense emitter electrode 24 and the sense upper surface electrode 54. A voltage drop of the current detection resistor R1 is proportional to a value of a current flowing through the sense upper surface electrode 54. A voltage corresponding to the current value flowing through the sense upper surface electrode 54 is generated in the current value output pad 50. The voltage of the current value output pad 50 is transmitted to a gate voltage control circuit 52, and the gate voltage control circuit 52 generates a gate voltage in accordance with the voltage of the current value output pad 50, and transmits the gate voltage to the gate pad 26. The gate pad 26 is connected to each of a gate electrode of the main switching element SWA and a gate electrode of the sense switching element SWB. Each of the main emitter electrode 22 and the sense upper surface electrode 54 is connected to an external power source 64, and the collector electrode 28 is connected to a load 56.

A parallel circuit of the main switching element SWA and the sense switching element SWB controls an electric power supplied from the external power source 64 to the load 56. A current value flowing through the main switching element SWA is proportional to a current value flowing through the sense switching element SWB. A voltage proportional to the latter is transmitted to the gate voltage control circuit 52. When the voltage proportional to the latter reaches a value corresponding to an excess current, the gate voltage control circuit 52 outputs a gate voltage by which the main switching element SWA and the sense switching element SWB are protected from the excess current. As will be described later, device structures of the main switching element SWA and the sense switching element SWB have same characteristics except for their different threshold voltages. A current-carrying area of the sense switching element SWB is small compared to a current-carrying area of the main switching element SWA, and thus the current flowing through the current detection resistor R1 is weak. An area in which the main switching element SWA is provided is a main region 10A, and an area in which the sense switching element SWB is provided is a sense region 10B. The main emitter electrode 22 also corresponds to an upper surface electrode provided in the main region 10A, and the sense emitter electrode 24 also corresponds to an upper surface electrode provided in the sense region 10B.

In the present embodiment, the current detection resistor R1 is provided within the semiconductor device 1, but alternatively the current detection resistor R1 may be arranged outside the semiconductor device 1. The gate voltage control circuit 52 (or a part thereof) may be provided inside the semiconductor device 1.

Figure 2:
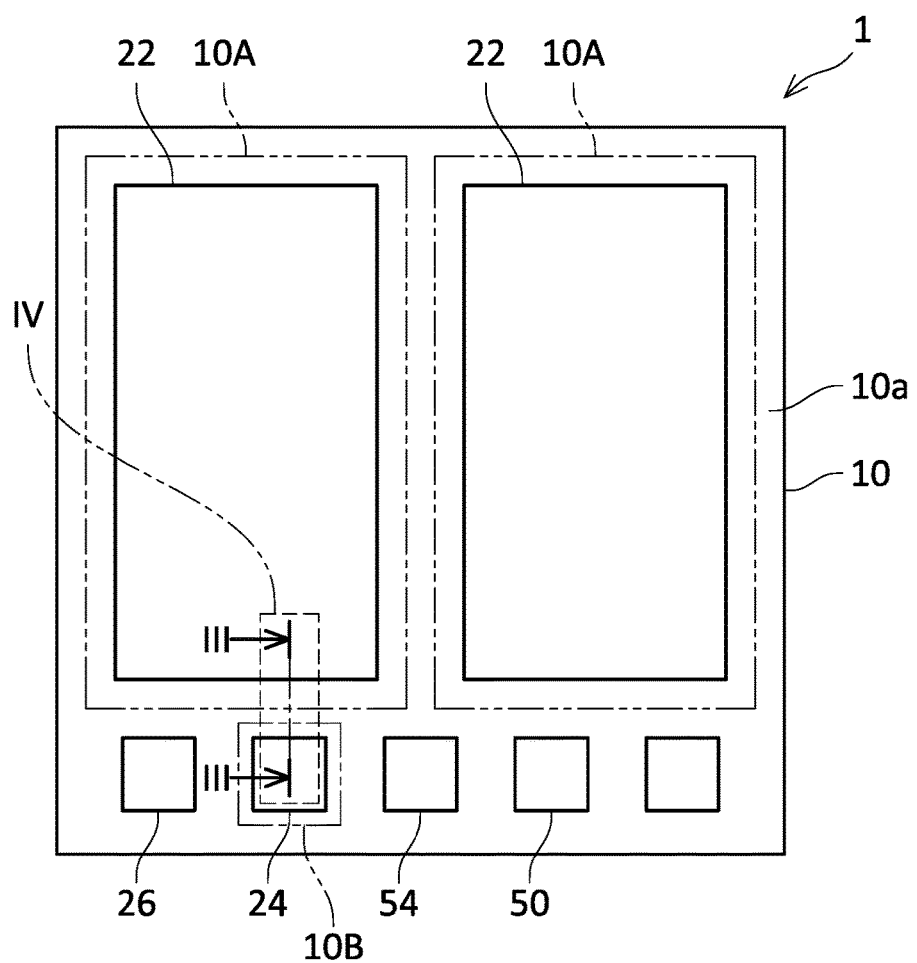
FIG. 2 is a plan view of the semiconductor device of the embodiment.

FIG. 2 is a plan view of the upper surface of the semiconductor device 1 according to the embodiment. The semiconductor device 1 comprises a semiconductor substrate 10. The main emitter electrode 22 which is divided into several pieces, the sense upper surface electrode 54, the current value output pad 50, the gate pad 26, and the sense emitter electrode 24 are provided on an upper surface 10a of the semiconductor substrate 10. A collector electrode 28 not shown in FIG. 2 is provided on a lower surface of the semiconductor substrate 10. A range where the main emitter electrode (main upper surface electrode) 22 is provided corresponds to the main region 10A, and a range where the sense emitter electrode 24 is provided corresponds to the sense region 10B. An area of the sense region 10B is smaller than an area of the main region 10A.

The sense emitter electrode 24 and sense upper surface electrode 54 are connected to each other via the current detection resistor R1 which is not shown in FIG. 2. During usage, the external power source 64 is connected to the main emitter electrode 22 and the sense upper surface electrode 54, the collector electrode 28 (see FIG. 1) is connected to the load 56, and the gate voltage control circuit 52 is connected to the current value output pad 50 and the gate pad 26. A part of the sense emitter electrode 24 may be used as the current value output pad 50.

Figure 3:
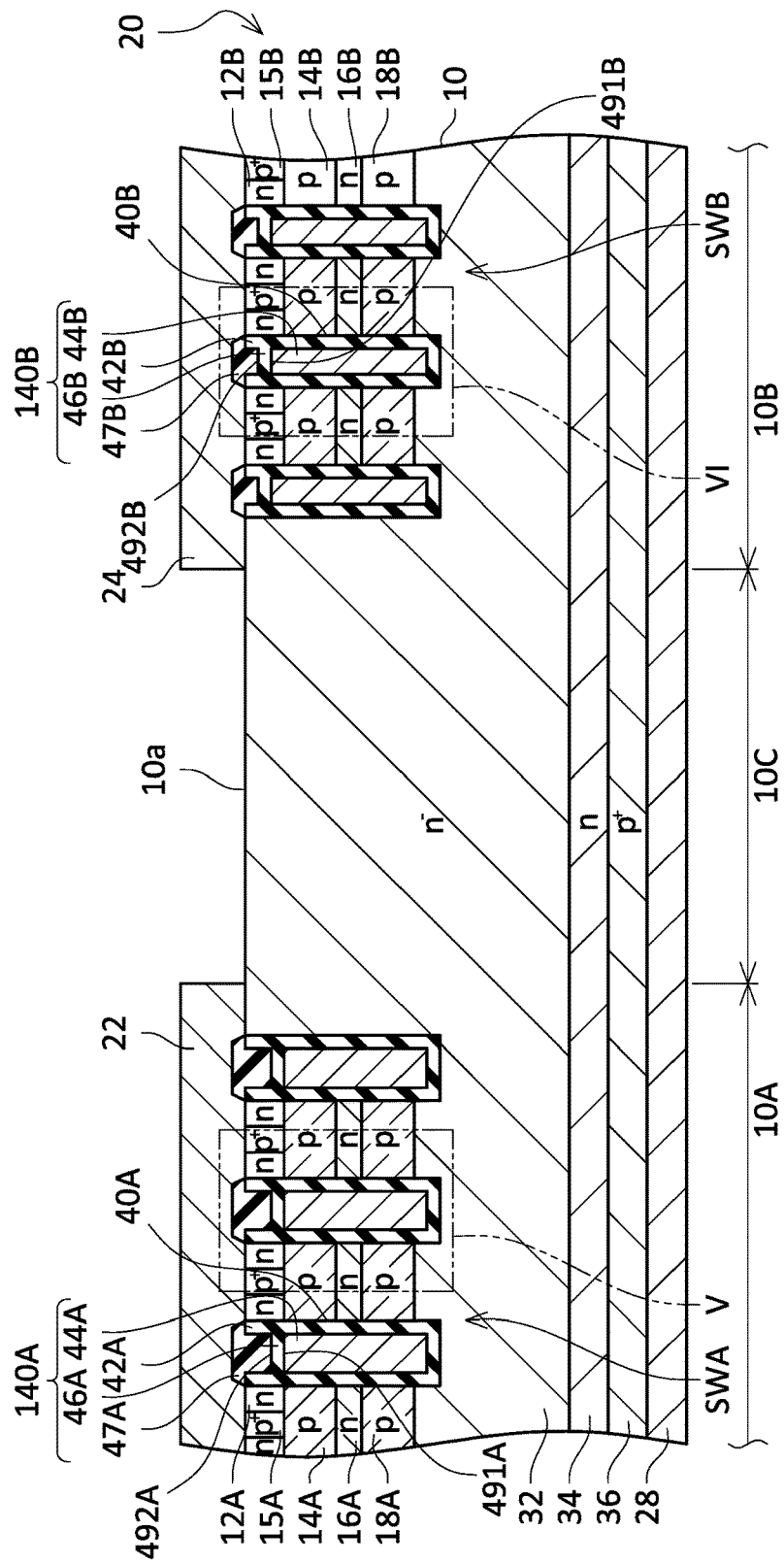
FIG. 3 is a cross-sectional view of the semiconductor device of the embodiment, corresponding to a line in FIG. 2.

FIG. 3 is a cross-sectional view corresponding to a line of FIG. 2. The main switching element SWA is provided in the semiconductor substrate 10 in a range corresponding to the main region 10A where the main emitter electrode 22 is provided, and the sense switching element SWB is provided in the semiconductor substrate 10 in a range corresponding to the sense region 10B where the sense emitter electrode 24 is provided. The main switching element SWA and the sense switching element SWB constitute the semiconductor element 20. An isolation region 10C where no switching element is provided exists between the main region 10A and the sense region 10B.

In the present embodiment, except that a width of trenches 40 to be described later is wide in the main switching element SWA and narrow in the sense switching element SWB, there are no differences between the main switching element SWA and the sense switching element SWB in the other respects. When distinguishing the main switching element SWA and the sense switching element SWB from each other, the former will be given a suffix A, and the latter will be given a suffix B to be explained. The suffixes A and B will be omitted when matters in which the main switching element SWA and the sense switching element SWB do not need to be distinguished from each other are explained.

Each of the main switching element SWA and the sense switching element SWB is an IGBT. As shown in FIG. 3, emitter regions 12, body contact regions 15, first body layers (upper body layers) 14, carrier accumulation layers 16, second body layers (lower body layers) 18, a drift layer 32, a buffer layer 34 and a collector layer 36, are provided in the semiconductor substrate 10.

Figure 4:
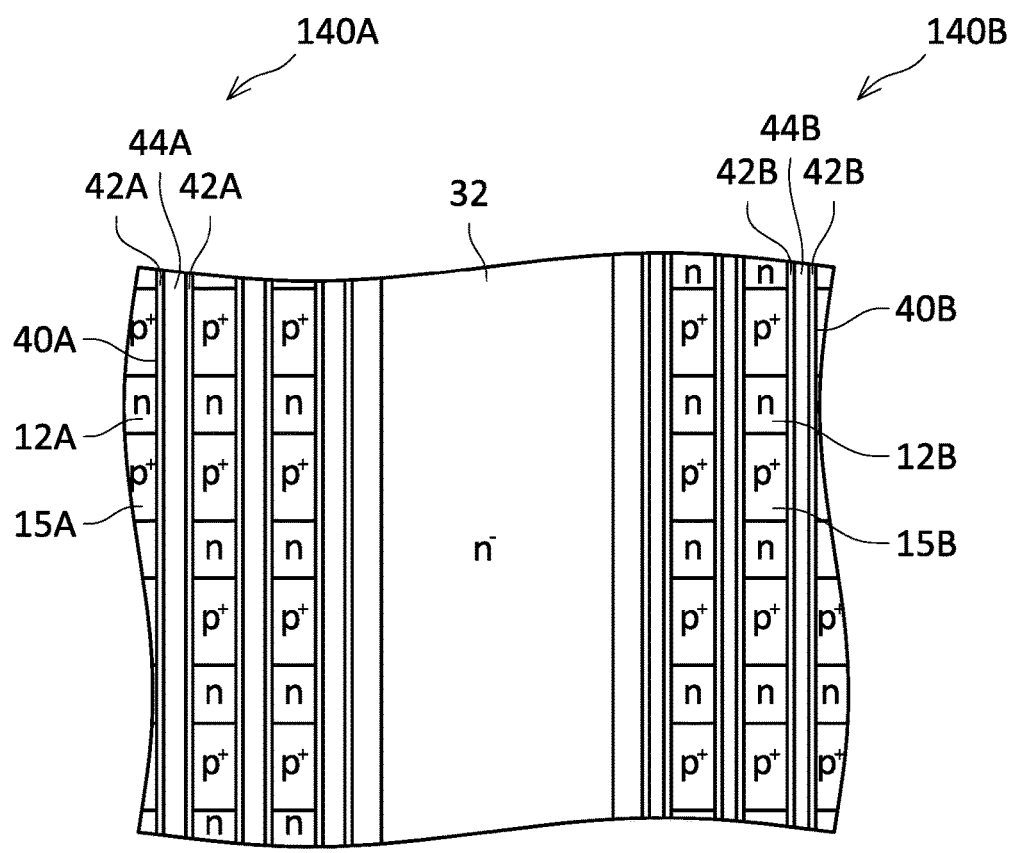
FIG. 4 is an enlarged view of a plan view of the semiconductor device of the embodiment; corresponding to a region IV of FIG. 2.

Each of the emitter regions 12 is of an n-type, and is provided in a range exposed on the upper surface 10a of the semiconductor substrate 10. As shown in FIG. 4, the emitter regions 12 extend long in a direction perpendicular to insulating trench gates 140 to be described later. A contour shape of each of the emitter regions 12A in the main region 10A is identical to a contour shape of each of the emitter regions 12B in the sense region 10B.

As shown in FIG. 3, each of the body contact regions 15 is a p+-type region having p-type impurities in high concentration, and is provided in a range exposed on the upper surface 10a of the semiconductor substrate 10. As shown in FIG. 4, the body contact regions 15 extend long in the direction perpendicular to the insulating trench gates 140. The contour shape of each of the body contact regions 15A in the main region 10A is identical to a contour shape of each of the body contact regions 15B in the sense region 10B.

As shown in FIG. 3, the first body layers 14 are p-type regions having a lower p-type impurity concentration than the body contact regions 15. Each of the first body layers 14 is provided below the corresponding emitter regions 12 and the corresponding body contact regions 15. Each of the first body layers 14 is electrically connected to the corresponding body contact regions 15 and is maintained at a same potential as those of the corresponding body contact regions 15.

Each of the carrier accumulation layers 16 is an n-type region. Each carrier accumulation layer 16 is provided below the corresponding first body layer 14, and is separated from the corresponding emitter regions 12 by the corresponding first body layer 14. Each carrier accumulation layer 16 is also separated from the drift layer 32 by the corresponding second body layer 18 to be described later. Each carrier accumulation layer 16 is an intermediate region separating the corresponding first body layer 14 and the corresponding second body layer 18.

The second body layers 18 are p-type regions having a p-type impurity concentration lower than the first body layers 14. Each of the second body layers 18 is provided below the corresponding carrier accumulation layer 16, and is separated from the corresponding first body layer 14 by the corresponding carrier accumulation layer 16.

The drift layer 32 is an n-type region containing n-type impurities in low concentration. The drift layer 32 is provided below the second body layers 18, and is separated from the carrier accumulation layers 16 by the second body layers 18.

The buffer layer 34 is an n-type region containing n-type impurities in high concentration. The buffer layer 34 is provided below the drift layer 32.

The collector layer 36 is a p-type region containing p-type impurities in high concentration. The collector layer 36 is provided below the buffer layer 34. The collector layer 36 is provided on an entire surface of a range exposed on the lower surface of the semiconductor substrate 10. The collector layer 36 is connected to the collector electrode 28.

As shown in FIG. 3, in the upper surface 10a of the semiconductor substrate 10, a plurality of trenches 40 extending from the upper surface 10a toward a deep side of the semiconductor substrate 10 is provided. As shown in FIG. 4, the trenches 40 extend parallel to each other. An inner surface of each of the trenches 40 is covered with a gate insulating film 42. A gate electrode 44 is disposed inside each of the trenches 40. Each of the gate electrodes 44 is constituted of conductive material, and is insulated from the semiconductor substrate 10 by the corresponding gate insulating film 42. An upper surface 491 of each of the gate electrodes 44 is covered with a cap insulating film 46. An interlayer insulating film 47 is provided on an upper surface 492 of each of the cap insulating films 46. Each of the gate electrodes 44 is connected to the gate pad 26 (see FIGS. 1 and 2). The trench 40, the gate insulating film 42, the gate electrode 44, the cap insulating film 46 and the interlayer insulating film 47, will be collectively referred to as an insulating trench gate 140.

Each of the trenches 40A provided in the main region 10A has a wide width, each of the wide gate electrodes provided in the main region 10A will be denoted as 44A, and each of the wide insulating trench gates will be denoted as 140A. Each of the trenches 40B provided in the sense region 10B has a narrow width, each of the narrow gate electrodes provided in the sense region 10B will be denoted as 44B, and each of the narrow insulating trench gates will be denoted as 140B.

The main emitter electrode (main upper surface electrode) 22 is insulated from each gate electrode 44A by the corresponding cap insulating film 46 and the corresponding interlayer insulating film 47. Similarly, the sense emitter electrode 24 is insulated from each gate electrode 44B by the corresponding cap insulating film 46B and the corresponding interlayer insulating film 47B. The collector electrode 28 is provided on the lower surface of the semiconductor substrate 10.

Each of the emitter regions 12 is in contact with the corresponding gate insulating film 42 on a side surface of the corresponding trench 40. Each of the emitter regions 12A in the main region 10A is electrically connected to the main emitter electrode (main upper surface electrode) 22. Each of the emitter regions 12B in the sense region 10B is electrically connected to the sense emitter electrode 24.

The body contact regions 15A in the main region 10A are electrically connected to the main emitter electrode (main upper surface electrode) 22, and the body contact regions 15B in the sense region 10B are electrically connected to the sense emitter electrode 24.

Each of the first body layers 14 is in contact with the corresponding gate insulating films 42 on the side surfaces of the corresponding trenches 40 below the corresponding emitter regions 12. Each of the carrier accumulation layers 16 is in contact with the corresponding gate insulating films 42 on the side surfaces of the corresponding trenches 40 below the corresponding first body layer 14. Each of the second body layers 18 is in contact with the corresponding gate insulating films 42 on the side surfaces of the corresponding trenches 40 below the corresponding carrier accumulation layer 16. The drift layer 32 is in contact with the gate insulating films 42 on the side surfaces and bottom surfaces of the trenches 40 below the second body layers 18.

Each of the trenches 40 extends from the upper surface 10a of the semiconductor substrate 10 to reach the drift layer 32 through the corresponding emitter regions 12, the corresponding first body layer 14, the corresponding carrier accumulation layer 16, and the corresponding second body layer 18.

Figure 5:
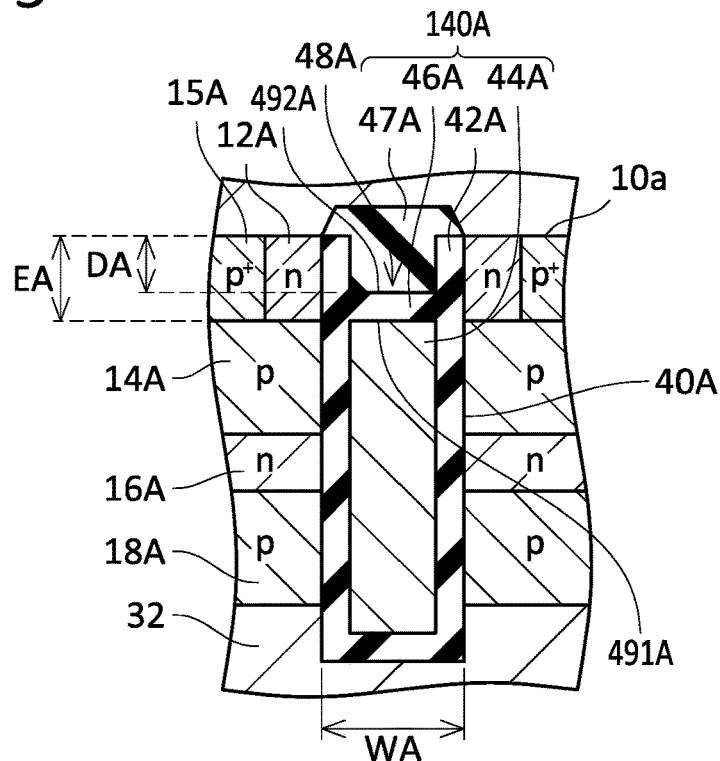
FIG. 5 is an enlarged cross-sectional view of the semiconductor device of the embodiment, corresponding to a region V of FIG. 3.
Figure 6:
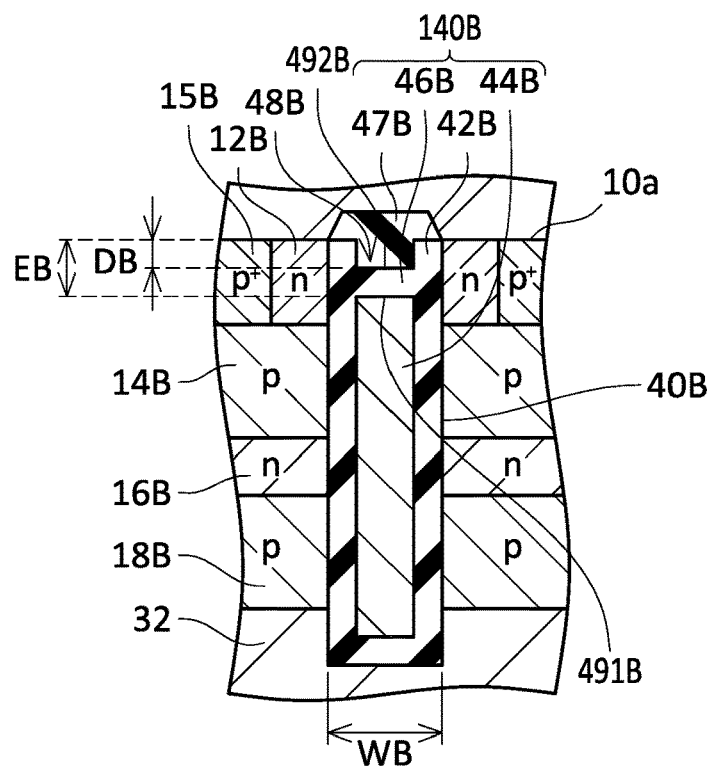
FIG. 6 is an enlarged cross-sectional view of the semiconductor device of the embodiment, corresponding to a region VI of FIG. 3.

FIG. 5 corresponds to a region V in FIG. 3, and is an enlarged sectional view of the main region 10A. FIG. 6 corresponds to a region VI of FIG. 3, and is an enlarged sectional view of the sense region 10B. FIG. 5 and FIG. 6 are shown at equal magnifications.

As shown in FIG. 5, an upper surface 491A of each of the gate electrodes 44A is positioned lower than the upper surface 10a of the semiconductor substrate 10, and an upper surface 492A of each of cap insulating films 46A is also positioned lower than the upper surface 10a of the semiconductor substrate 10. Due to this, a recess 48A recessed with respect to the upper surface 10a of the semiconductor substrate 10 is provided above each of the gate electrodes 44A. Similarly, as shown in FIG. 6, an upper surface 491B of each of the gate electrodes 44B is positioned lower than the upper surface 10a of the semiconductor substrate 10, and an upper surface 492B of each of cap insulating films 46B is also positioned lower than the upper surface 10a of the semiconductor substrate 10. Due to this, a recess 48B recessed with respect to the upper surface 10a of the semiconductor substrate 10 is provided above each of the gate electrodes 44B. As shown in FIGS. 5 and 6, a width WA of each of the trenches 40A in a short direction is wider than a width WB of each of the trenches 40B in the short direction. Corresponding to this, the upper surface 491A of each gate electrode 44A is positioned on a lower surface side of the semiconductor substrate 10 than the upper surface 491B of each gate electrode 44B. Since thicknesses of the cap insulating films 46 are substantially the same in the main region 10A and in the sense region 10B, the upper surface 492A of each cap insulating film 46A is positioned on the lower surface side of the semiconductor substrate 10 than the upper surface 492B of each cap insulating film 46B.

In other words, a distance EA between the upper surface 10a of the semiconductor substrate 10 and the upper surface 491A of each of the gate electrodes 44A is longer than a distance EB between the upper surface 10a of the semiconductor substrate 10 and the upper surface 491B of each of the gate electrodes 44B. A distance DA between the upper surface 10a of the semiconductor substrate 10 and the upper surface 492A of each of the cap insulating films 46A is longer than a distance DB between the upper surface 10a of the semiconductor substrate 10 and the upper surface 492B of each of the cap insulating films 46B. A depth of each of the recesses 48A corresponds to the distance DA, and a depth of each of the recesses 48B corresponds to the distance DB.

FIGS. 5 and 6 show a state after forming the interlayer insulating films 47A and 47B in the recesses 48 A and 48 B respectively, and the recesses 48A and 48B do not exist in this state. The recesses 48A and 48B exist before the formation of the interlayer insulating films 47A and 47B.

Figure 7:
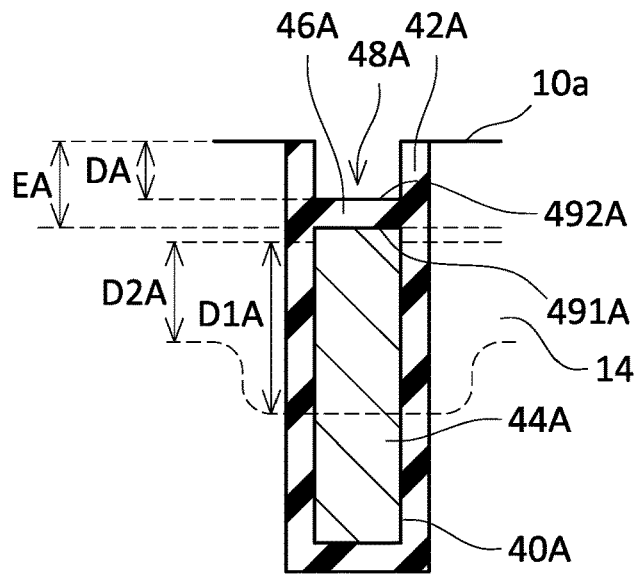
FIG. 7 is an enlarged cross-sectional view of the semiconductor device of the embodiment, showing a shape of a first body layer of the region V.
Figure 8:
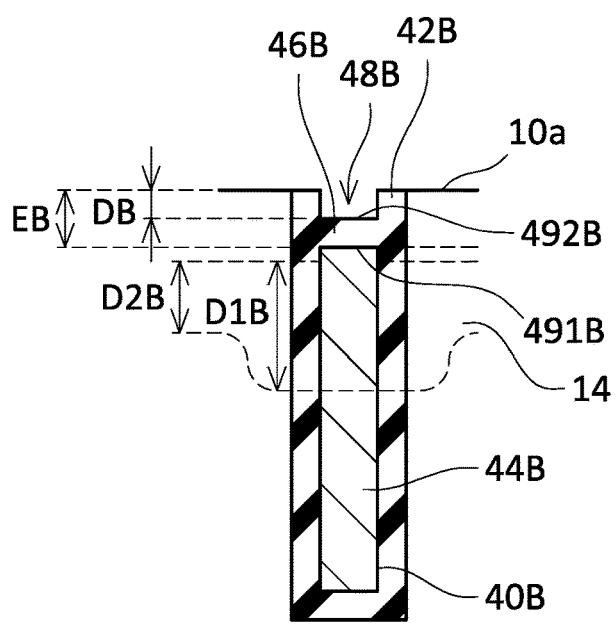
FIG. 8 is an enlarged cross-sectional view of the semiconductor device of the embodiment, showing a shape of the first body layer of the region VI.

As shown in FIGS. 5 and 6, in a state where the recesses 48A have been formed above the gate electrodes 44A in the main region 10A and the recesses 48B have been formed above the gate electrodes 44B in the sense region 10B (i.e., before formation of the interlayer insulating films 47A and 47B), p-type impurities are ion-implanted from the upper surface 10a of the semiconductor substrate 10 to form the first body layers 14. At this occasion, the ion-implantation concentration into the respective first body layers 14 is affected by shapes of the recesses 48A and 48B. As shown in FIGS. 7 and 8, the p-type impurities implanted from the upper surface 10a of the semiconductor substrate 10 penetrate deeply into the semiconductor substrate 10 and stop directly below and in vicinities of the recesses 48A and 48B due to the presence of the recesses 48A and 48B. That is, a phenomenon occurs that in the semiconductor substrate 10 in the vicinity of each gate electrode 44A, 44B, the impurities penetrate more deeply and stop as the impurities get closer to the gate electrode 44A, 44B. A depth where the impurity concentration takes its maximum value shifts toward the deep side with a closer distance to each gate electrode 44A, 44B, and a lower surface of the corresponding first body layer 14 become deeper with a closer distance to the gate electrode 44A, 44B. As such, a thickness of each first body layer 14 becomes thicker with a closer distance to the corresponding gate electrode 44A, 44B. Since an impurity implantation amount per unit area is uniform in a plan view of the semiconductor substrate 10, the impurity concentration in each first body layer 14 becomes lower with a closer distance to the corresponding gate electrodes 44A, 44B.

Figure 9:
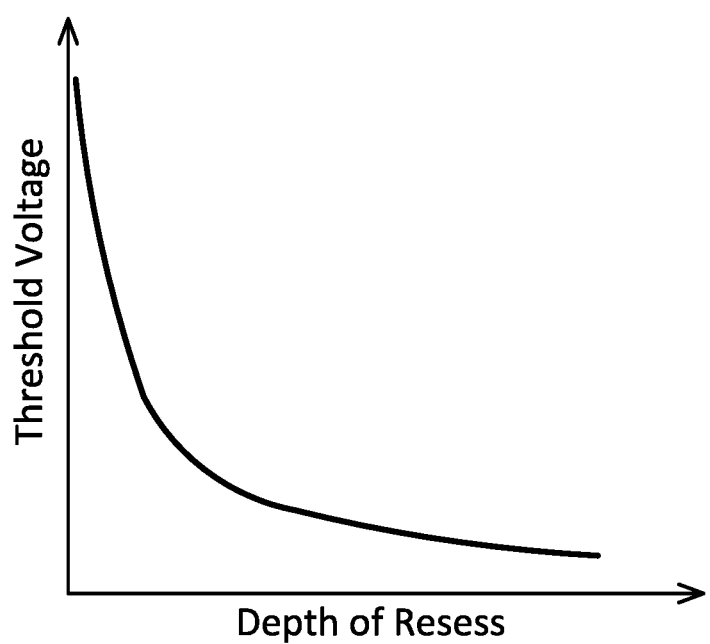
FIG. 9 is a graph showing a relationship between a depth of a recess and a threshold voltage.

As shown in FIGS. 7 and 8, the distance EA between the upper surface 10a of the semiconductor substrate 10 and the upper surface 491A of each gate electrode 44A is longer than the distance EB between the upper surface 10a of the semiconductor substrate 10 and the upper surface 491B of each gate electrode 44B. Since the thicknesses of the cap insulating films 46 are substantially the same in the main region 10A and the sense region 10B, the distance DA between the upper surface 10a of the semiconductor substrate 10 and the upper surface 492A of each cap insulating film 46A is longer than the distance DB between the upper surface 10a of the semiconductor substrate 10 and the upper surface 492B of each cap insulating film 46B. That is, the depth DA of each recess 48A in the main region 10A is deeper than the depth DB of each recess 48B in the sense region 10B. Thus, the impurities penetrate more deeply and stop immediately below and near the recesses 48A than immediately below and near the recesses 48B. The depth at which the impurity concentration becomes greatest (i.e., "peak depth") shifts toward the deep side with a closer distance to each gate electrode 44A, 44B. Since the depth DA of each recess 48A in the main region 10A is deeper than the depth DB of each recess 48B in the sense region 10B, a shift amount of the peak depth is large in the main region 10A, and small in the sense area 10B. A degree by which the impurity concentration of each first body layer 14 becomes lower toward the corresponding gate electrodes 44 is great in the main region 10A and small in the sense region 10B. Accordingly, the p-type impurity concentration in a portion of a width D1A of the first body layer 14A (region where channel is to be formed) in the main region 10A is lower than the p-type impurity concentration in a portion of a width D1B of the first body layer 14B (region where channel is to be formed) in the sense region 10B. As a result of this, the threshold voltage of the main region 10A becomes lower than the threshold voltage of the sense region 10B. An example of a relationship between the depth of the recess and the threshold voltage is shown in FIG. 9. As described above, the p-type impurity concentration becomes lower as the depth of the recess becomes deeper. That is, the threshold voltage becomes lower as the depth of the recess becomes deeper.

As described above, the main switching element SWA is constituted of the main emitter electrode 22, the emitter regions 12A, the body contact regions 15A, the first body layer 14A, the carrier accumulation layer 16A, the second body layer 18A, the insulating trench gates 140A, the drift layer 32, the buffer layer 34, the collector layer 36, and the collector electrode 28. The sense switching element SWB is constituted of the sense emitter electrode 24, the emitter regions 12B, the body contact regions 15B, the first body layer 14B, the carrier accumulation layer 16B, the second body layer 18B, the insulating trench gates 140B, the drift layer 32, the buffer layer 34, the collector layer 36, and the collector electrode 28. The main switching element SWA switches a current flowing between the collector electrode 28 and the main emitter electrode 22 based on the gate voltage applied to the gate electrodes 44A. The sense switching element SWB switches a current flowing between the collector electrode 28 and the sense emitter electrode 24 based on the gate voltage applied to the gate electrodes 44B.

Next, a method of manufacturing the semiconductor device 1 will be described.

(Trench Forming Step)

Figure 10:
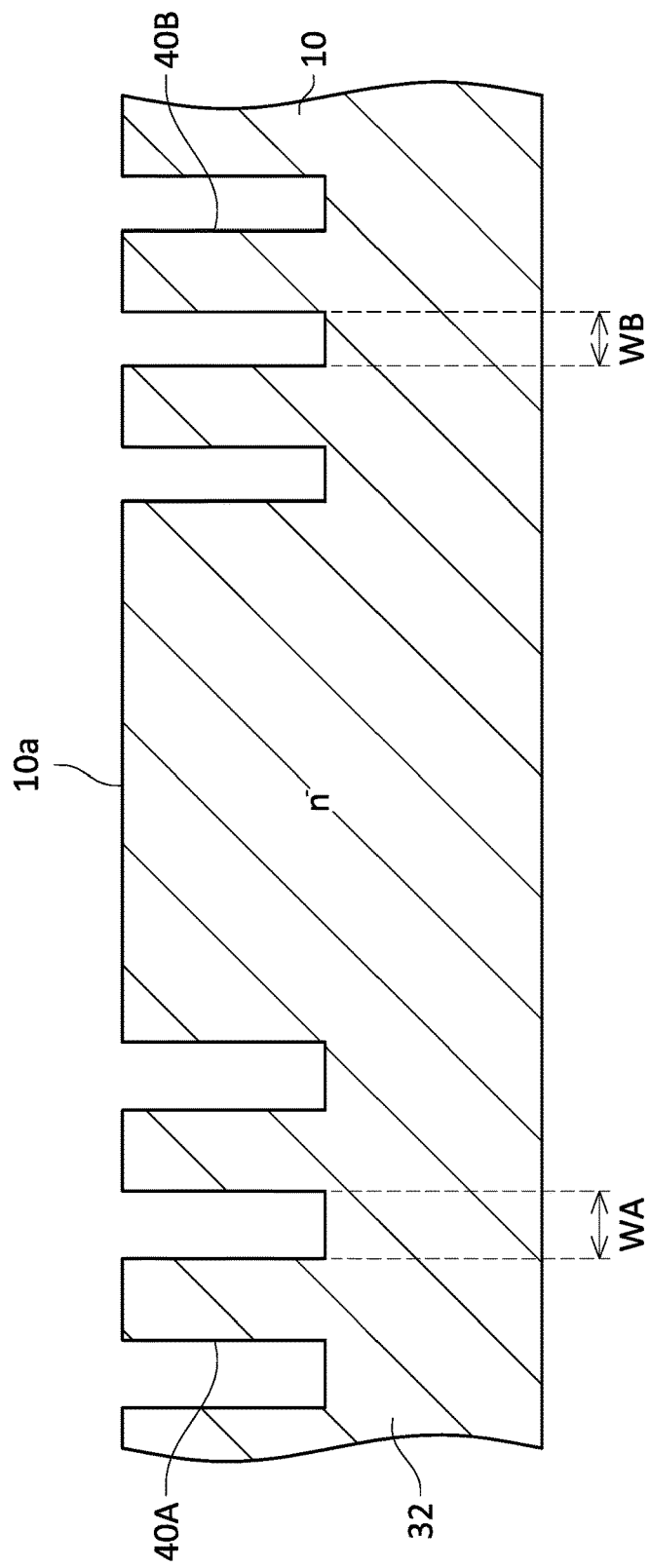
FIG. 10 is a diagram for explaining a method of manufacturing the semiconductor device of the embodiment, and is a cross-sectional view of the semiconductor device after a process of forming trenches.

As shown in FIG. 10, the trenches 40A and the trenches 40B are formed in the upper surface 10a of the semiconductor substrate 10 by etching through RIE. The wide trenches 40A are formed in the main region 10A and the narrow trenches 40B are formed in the sense region 10B. The width WA in the short direction of each of the trenches 40A is wider than the width WB in the short direction of each of the trenches 40B.

(Gate Insulating Film Forming Step)

After forming the trenches 40A and the trenches 40B, the semiconductor substrate 10 is heat-treated to form a sacrifice oxide film on the upper surface 10a of the semiconductor substrate 10 and the inner surfaces of the trenches 40A and the trenches 40B. Thereafter, the sacrifice oxide film is removed through etching. After removing the sacrifice oxide film, the semiconductor substrate 10 is heat-treated again to form a silicon oxide film on the upper surface 10a of the semiconductor substrate 10 and the inner surfaces of the trenches 40A and 40B. The silicon oxide film in each of the trenches 40 becomes the gate insulating film 42.

(Gate Electrode Forming Step)

Figure 11:
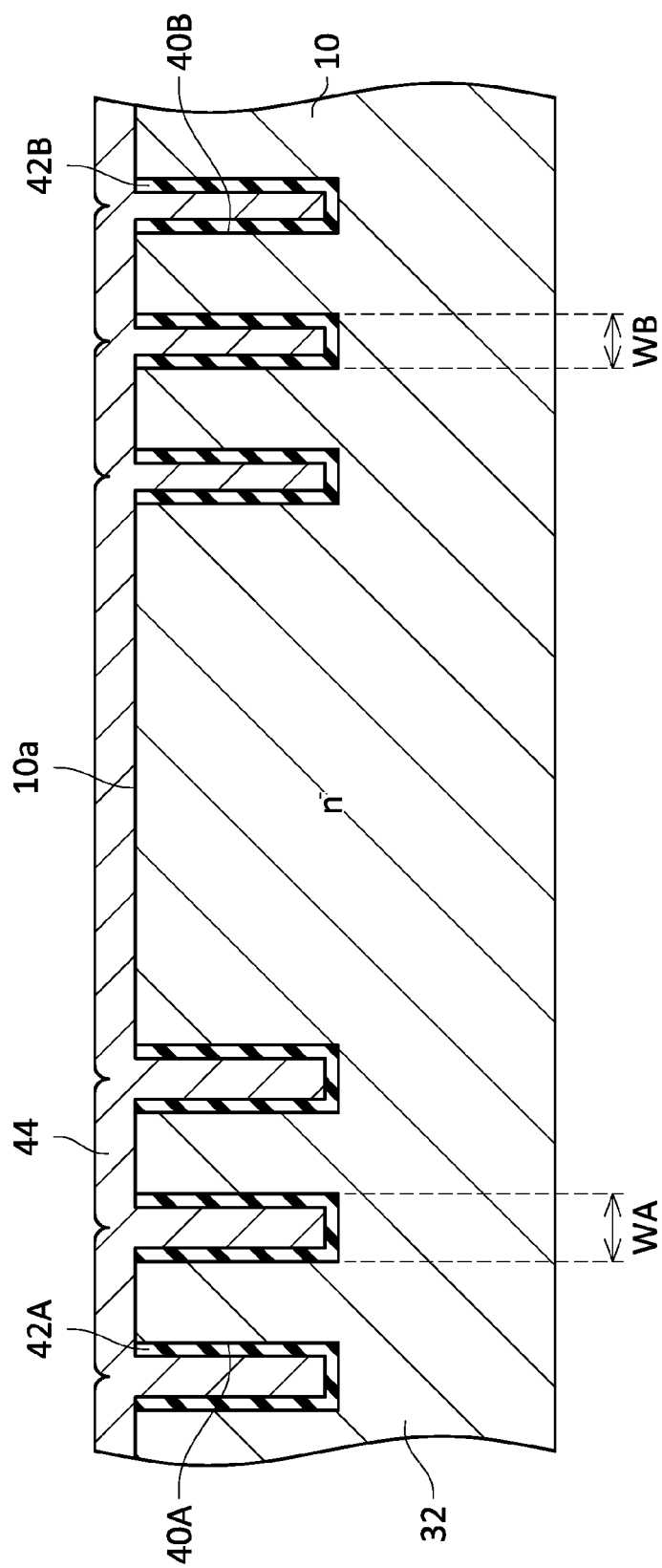
FIG. 11 is a diagram for explaining the method of manufacturing the semiconductor device of the embodiment, and is a cross-sectional view of the semiconductor device after filling a conductive material in the trenches.

After the gate insulating films 42 is formed, polysilicon (an example of a conductive material) is deposited on the semiconductor substrate 10 through CVD (chemical vapor deposition). At this occasion, polysilicon is filled in the trenches 40A and the trenches 40B. As shown in FIG. 11, polysilicon is deposited until each of the upper surfaces of the polysilicon filled inside the trenches 40A and the trenches 40B becomes higher than the upper surface 10a of the semiconductor substrate 10.

Figure 12:
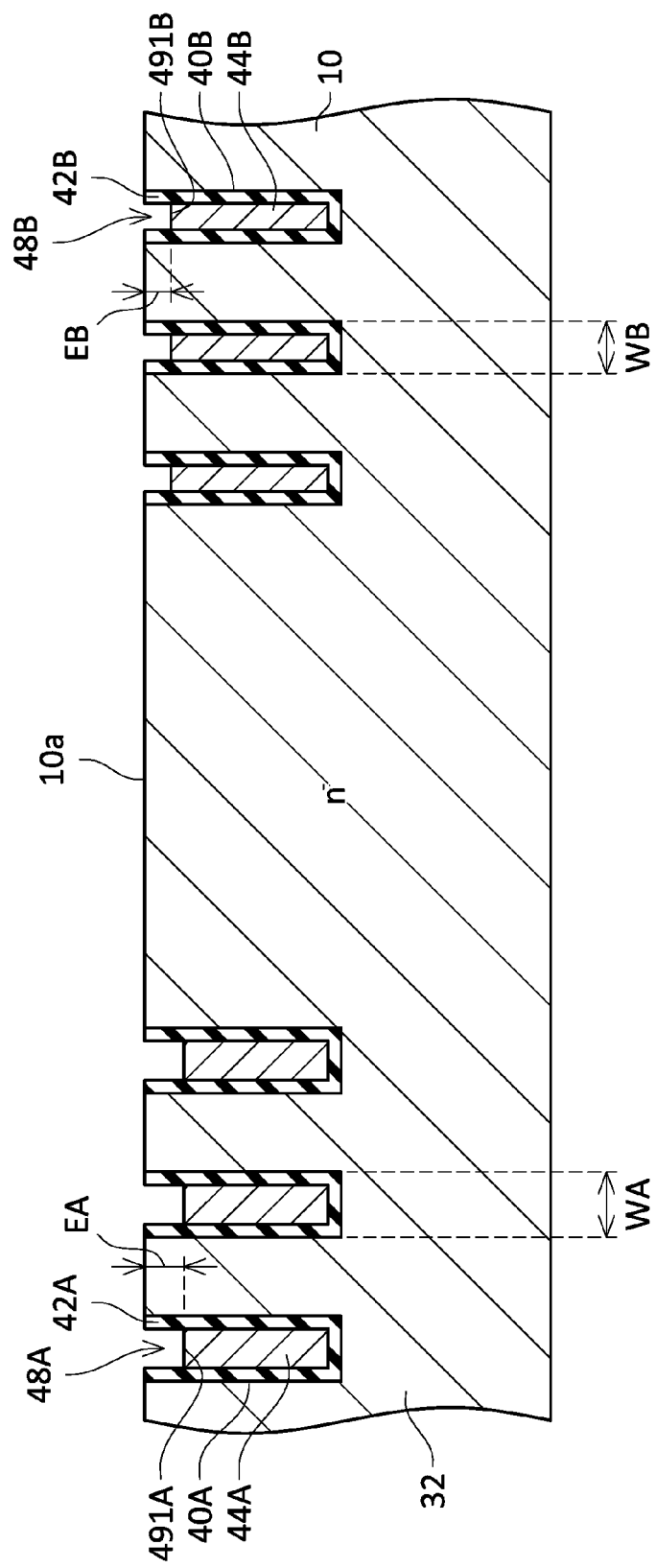
FIG. 12 is a diagram for explaining the method of manufacturing the semiconductor device of the embodiment, and is a cross-sectional view of the semiconductor device after etching the conductive material filled in the trenches.
Figure 16:
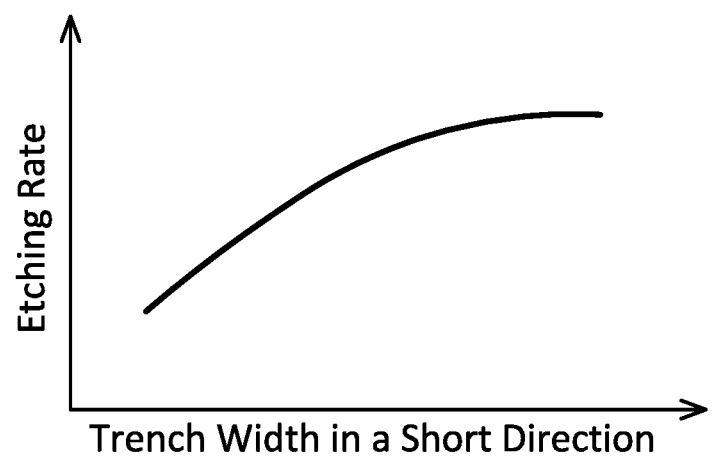
FIG. 16 is a graph showing a relationship between a trench width in a short direction and an etching rate.

After depositing the polysilicon, the polysilicon deposited outside the trenches 40A and the trenches 40B is etched through CDE (chemical dry etching) etc. to be removed therefrom. As shown in FIG. 12, the polysilicon remaining in each of the trenches 40A becomes the gate electrode 44A. The polysilicon remaining in each of the trenches 40B becomes the gate electrode 44B. Each of the gate electrodes 44A and 44B is formed such that the upper surface 491 of each of the gate electrodes 44A and 44B exists at a position recessed from the upper surface 10a of the semiconductor substrate 10. Here, FIG. 16 shows an example of a relationship between the width in the short direction of a trench and the etching rate. The wider the width of the trench in the short direction is, the higher the etching rate is. The width WA in the short direction of each trench 40A is wider than the width WB in the short direction of each trench 40B. Therefore, the etching rate in each trench 40A is higher than the etching rate in each trench 40B. That is, the upper surface 491A of each gate electrode 44A is positioned deeper than the upper surface 491B of each gate electrode 44B. Accordingly, the distance EA between the upper surface 10a of the semiconductor substrate 10 and the upper surface 491A of each gate electrode 44A is longer than the distance EB between the upper surface 10a of the semiconductor substrate 10 and the upper surface 491B of each gate electrode 44B.

(Cap Insulating Film Forming Step)

Figure 13:
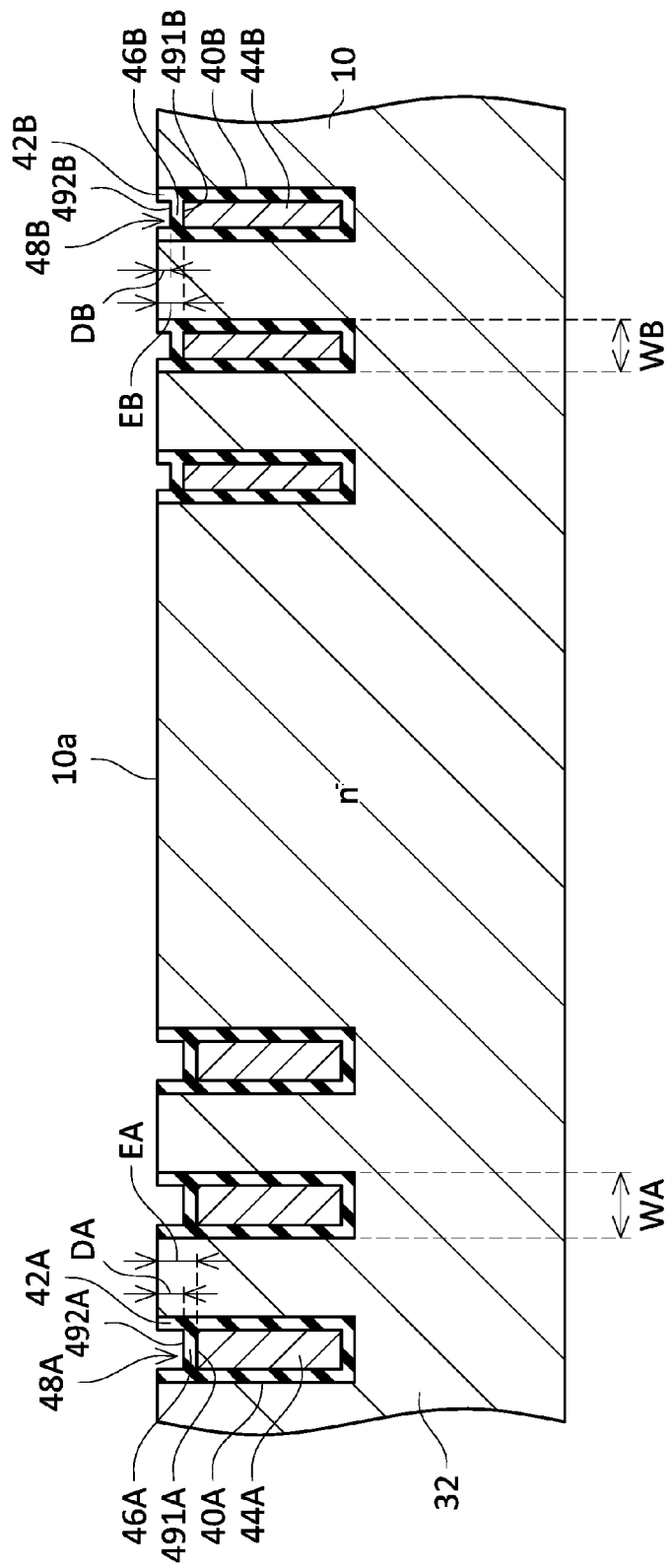
FIG. 13 is a diagram for explaining the method of manufacturing the semiconductor device of the embodiment, and is a cross-sectional view of the semiconductor device after a process of forming cap insulating films.

After forming the gate electrodes 44 A and the gate electrodes 44 B, the semiconductor substrate 10 is heat-treated. Due to this, the cap insulating film 46A is formed on the upper surface 491A of each of the gate electrodes 44A. Similarly, the cap insulating film 46B is formed on the upper surface 491B of each of the gate electrodes 44B. This makes a cross sectional structure of the semiconductor substrate 10 a structure shown in FIG. 13. The distance EA between the upper surface 10a of the semiconductor substrate 10 and the upper surface 491A of each gate electrode 44A is longer than the distance EB between the upper surface 10a of the semiconductor substrate 10 and the upper surface 491B of each gate electrode 44B. Since the thicknesses of the cap insulating films 46 are substantially the same in the main region 10A and the sense region 10B, the distance DA between the upper surface 10a of the semiconductor substrate 10 and the upper surface 492A of each cap insulating film 46A is longer than the distance DB between the upper surface 10a of the semiconductor substrate 10 and the upper surface 492B of each cap insulating film 46B in the sense region 10B. In the present embodiment, a step between the upper surface 10a of the semiconductor substrate 10 and the upper surface 492A of each cap insulating film 46A is referred to as the recess 48A. Similarly, a step between the upper surface 10a of the semiconductor substrate 10 and the upper surface 492B of each cap insulating film 46B is referred to as the recess 49B. A depth of each recess 48A corresponds to the distance DA, and a depth of each recess 48B corresponds to the distance DB. Therefore, the depth DA of each recess 48A in the main region 10A is deeper than the depth DB of each recess 48B in the sense region 10B.

(Ion Implantation Step)

N-type impurities are implanted into a depth corresponding to the carrier accumulation layers 16 from an upper surface 10a side of the semiconductor substrate 10 (carrier accumulation layer implantation step). That is, an accelerating voltage is adjusted during implantation so that the implanted n-type impurities stop within the depth range corresponding to the carrier accumulation layers 16.

Next, p-type impurities are implanted into a depth corresponding to the second body layers 18 from the upper surface 10a side of the semiconductor substrate 10 (second body layer implantation step). That is, the accelerating voltage is adjusted during implantation so that the implanted p-type impurities stop within the depth range corresponding to the second body layers 18. Next, p-type impurities are implanted into a depth corresponding to the first body layers 14 from the upper surface 10a side of the semiconductor substrate 10 (first body layer implantation step). That is, the accelerating voltage is adjusted during implantation so that the implanted p-type impurities stop within the depth range corresponding to the first body layers 14. It should be noted that in the first body layer implantation step the p-type impurities are implanted at a higher concentration than in the second body layer implantation step. Since the second body layers 18 are inverted before the inversion layers are formed in the first body layers 14, a substantive threshold voltage is determined by the first body layers 14. As described above, the impurity concentration of a region of each first body layer 14 that corresponds to the side surface of the corresponding trenches 40 is low in the main region 10A and high in the sense region 10B. The impurity concentration of the first body layers 14 is set to be one by which a conductivity type of each region opposed to the corresponding gate electrode 44 via the corresponding insulating film 42 is inverted from the p-type to the n-type by the voltage applied to the gate electrodes 44.

Next, n-type impurities are implanted into a depth corresponding to the emitter regions 12 (that is, an uppermost layer portion) from the upper surface 10a side of the semiconductor substrate 10 (emitter region implantation step).

Next, p-type impurities are implanted into a depth corresponding to the body contact regions 15 (that is, the uppermost layer portion) from the upper surface 10a side of the semiconductor substrate 10 (body contact region implantation step).

(Thermal Diffusion Step)

Figure 14:
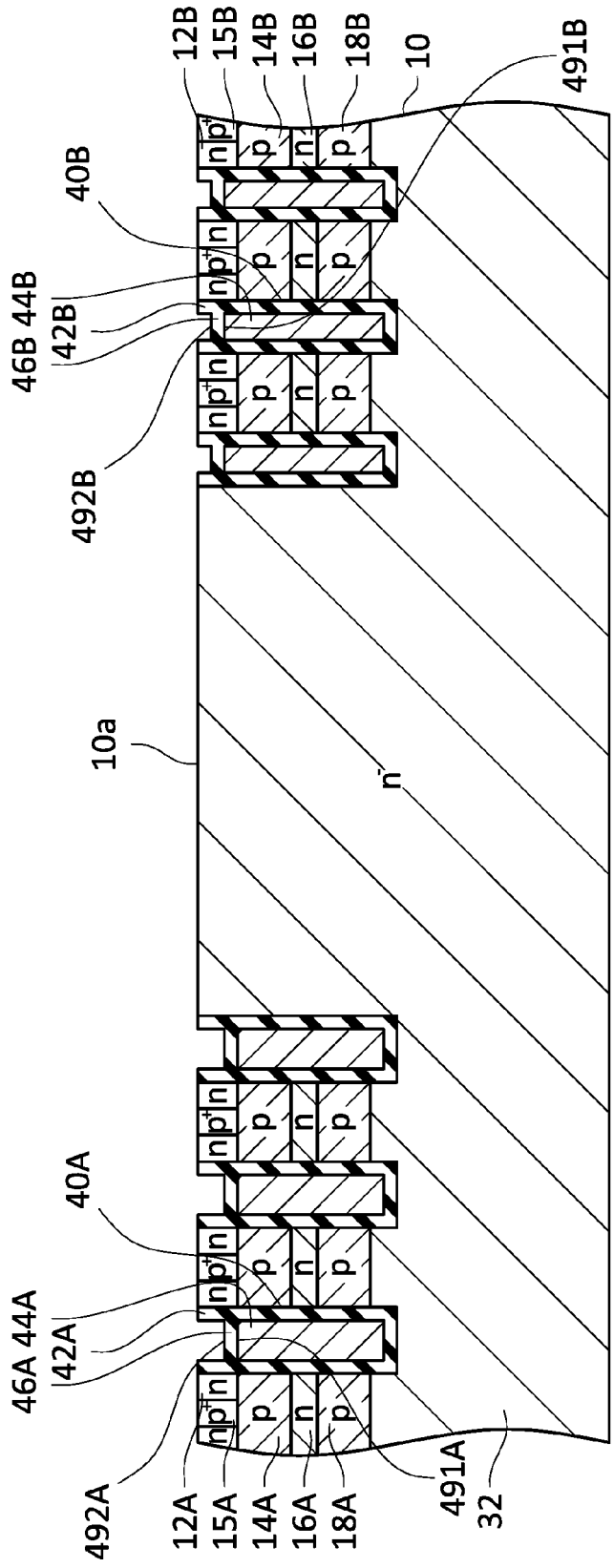
FIG. 14 is a diagram for explaining the method of manufacturing the semiconductor device of the example, and is a cross-sectional view of the semiconductor device after a process of forming diffusion layers on an upper surface side.

When the ion implantation steps have been completed, the semiconductor substrate 10 is heat-treated. With the heat treatment, the implanted impurities are diffused and activated. Due to this, the semiconductor region shown in FIG. 14 is completed.

Figure 15:
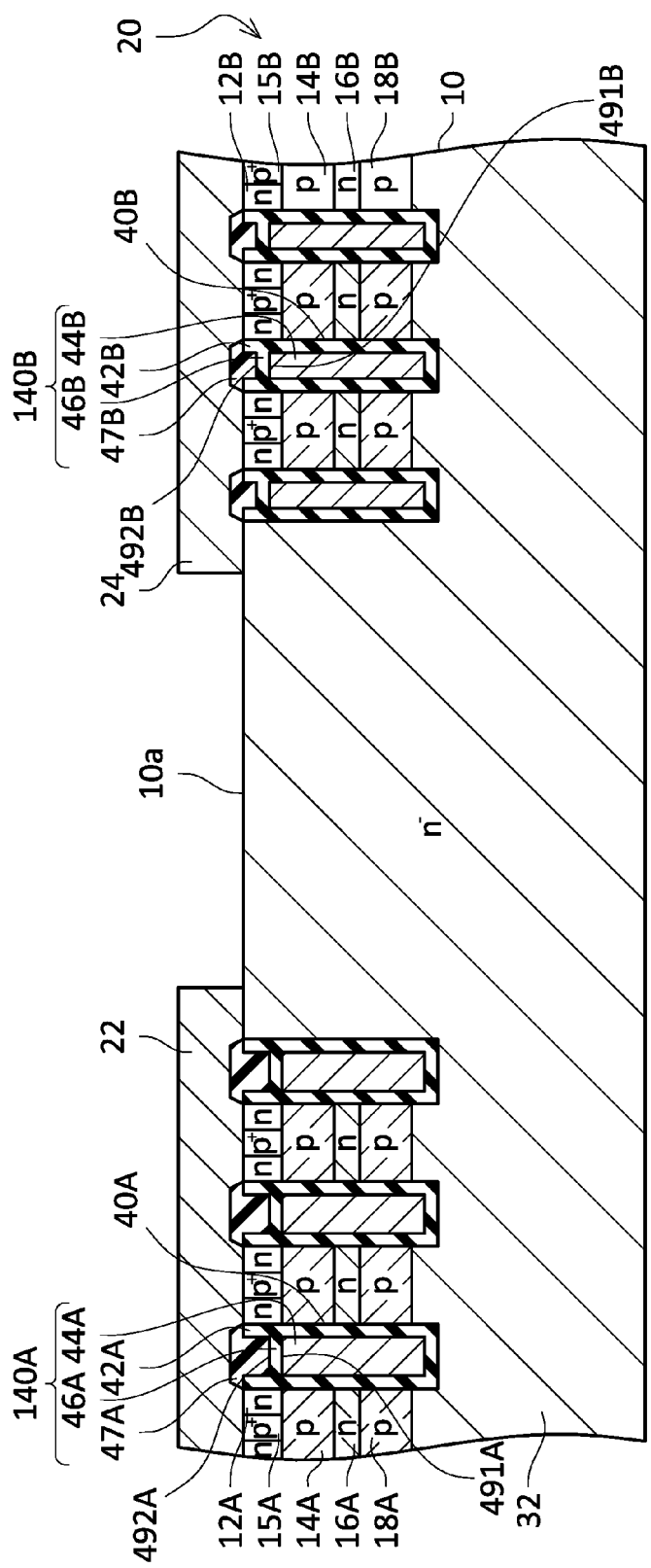
FIG. 15 is a diagram for explaining the method of manufacturing the semiconductor device of the embodiment, and is a cross-sectional view of the semiconductor device after a process of forming interlayer insulating films and emitter electrodes.

After the thermal diffusion step is completed, interlayer insulating films 47 filling the respective recesses 48 are formed. Thereafter, the main emitter electrode 22 and the sense emitter electrode 24 are formed. With the above steps, a state shown in FIG. 15 is obtained. Further, one or more of mounting electrodes, insulating films and the like (not shown) are formed on the surface of the semiconductor substrate. It should be noted that the emitter electrodes 22 and 24, the mounting electrodes, the insulating films and the like may be formed after a lower surface side diffusion layer forming step to be described below.

(Lower Surface Side Diffusion Layer Forming Step)

Next, ions are implanted from the lower surface of the semiconductor substrate 10 and thermal diffusion is performed, and thereby the buffer layer 34 and the collector layer 36 shown in FIG. 3 are formed. Next, the collector electrode 28 is formed on the lower surface of the semiconductor substrate 10. Thereafter, the semiconductor substrate 10 is diced to be divided into several pieces. Due to this, the semiconductor device shown in FIG. 3 is completed. It should be noted that the emitter electrodes 22 and 24, the mounting electrodes and the insulating films (not shown) and the like may be formed before or after the step of forming the collector electrode 28.

As described above, according to the above-described manufacturing method, it is possible to manufacture the semiconductor device 1 in which the p-type impurity concentration of the first body layer 14A in the region where the channel is formed is lower than the p-type impurity concentration of the first body layer 14B in the region where the channel is formed.

Next, an operation of the semiconductor device 1 will be described. When the main switching element SWA and the sense switching element SWB are turned on, a current flows between the load 56 and the external power source 64 (see FIG. 1). Most of the current flows through the main switching element SWA (i.e., the main emitter electrode 22). Part of the current flows through the sense switching element SWB (i.e., the sense upper surface electrode 54). The current flowing through the sense switching element SWB can be measured by a potential difference between both ends of the current detection resistor R1. A ratio of the current flowing through the main switching element SWA to the current flowing through the sense switching element SWB is substantially equal to a ratio of a total length of channels formed in the main region 10A to a total length of channels formed in the sense region 10B. Accordingly, the current of the main switching element SWA can be detected by detecting the current of the sense switching element SWB.

In the semiconductor device 1, the p-type impurity concentration of the first body layer 14A where the channel is formed in the main region 10A is lower than the p-type impurity concentration of the first body layer 14B where the channel is formed in the sense region 10B. That is, the threshold voltage of the sense switching element SWB is higher than the threshold voltage of the main switching element SWA. Due to this, the main switching element SWA is turned on earlier than the sense switching element SWB. Accordingly, current concentration on the sense switching element SWB can be suppressed. Therefore, an erroneous detection that the current flowing through the main switching element SWA is detected as excessively great can be prevented.

In the above embodiment, the IGBT is explained as an example of the main switching element SWA and the sense switching element SWB, but it may be an FET.

In the above embodiment, the structure in which the cap insulating film 46 is formed on the upper surface 491 of each of the gate electrodes 44 is described. Alternatively, the interlayer insulating film 47 may be formed directly on the upper surface 491 of each of the gate electrodes 44 without forming the cap insulating films 46 on the upper surfaces 491 of the gate electrodes 44. In this case, a step between the upper surface 10a of the semiconductor substrate 10 and the upper surface 491A of each gate electrode 44A corresponds to the recess 48A. Similarly, a step between the upper surface 10a of the semiconductor substrate 10 and the upper surface 491B of each gate electrode 44B corresponds to the recess 48B.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A method of manufacturing a semiconductor device, the method comprising:
   forming trenches in an upper surface of a semiconductor substrate, the semiconductor substrate comprising a first region having a first threshold voltage and a second region having a second threshold voltage that is higher than the first threshold voltage, wherein each of the first region and the second region comprises: a first semiconductor region of a first conductivity type provided at a position exposed on an upper surface of the semiconductor substrate; a second semiconductor layer of a second conductivity type provided on a deep side of the first semiconductor region, and being in contact with the first semiconductor region; and a third semiconductor layer of the first conductivity type provided on a deep side of the second semiconductor layer, and separated from the first semiconductor region by the second semiconductor layer; the trenches extending from the upper surface of the semiconductor substrate to a deep side of the semiconductor substrate to reach the third semiconductor layer through the first semiconductor region and the second semiconductor layer, and in a plan view of the semiconductor substrate, the trenches in the first region having a first width, and the trenches in the second region having a second width that is narrower than the first width; forming insulating films on inner surfaces of the trenches in the first and second regions; filling conductive material inside the trenches in the first and second regions of which the inner surfaces are covered with the insulating films, the conductive material being insulated from the semiconductor substrate by the corresponding insulating film; etching the conductive material from an upper surface side of the semiconductor substrate such that each of upper surfaces of the conductive material filled inside the trenches in the first and second regions becomes lower than the upper surface of the semiconductor substrate; and forming, after the etching of the conductive material, an impurity layer by implanting impurities from the upper surface of the semiconductor substrate to a predetermined depth range, the impurity layer having an impurity concentration such that a conductivity type of the impurity layer is inverted at least in a region opposed to the conductive material via each insulating film when a potential is applied to the conductive material; wherein outer edges of upper surfaces of the conductive material in the first region are positioned closer to a deep side of the semiconductor substrate than outer edges of upper surfaces of the conductive material in the second region are.

2. The method according to claim 1, wherein the semiconductor device comprises a main region and a sense region, and the first threshold voltage in the main region is lower than the second threshold voltage in the sense region
the first region includes the main region,
the second region includes the sense region,
the filling comprises filling the conductive material inside the trenches in the first and second regions such that the upper surface of the conductive material becomes higher than the upper surface of the semiconductor substrate.

3. A semiconductor device comprising a first region having a first threshold voltage and a second region having a second threshold voltage that is higher than the first threshold voltage, the first region and the second region being provided in a common semiconductor substrate, wherein
each of the first region and the second region comprises:
a first semiconductor region of a first conductivity type provided at a position exposed on an upper surface of the semiconductor substrate;
a second semiconductor layer of a second conductivity type provided on a deep side of the first semiconductor region, and being in contact with the first semiconductor region;
a third semiconductor layer of the first conductivity type provided on a deep side of the second semiconductor layer, and separated from the first semiconductor region by the second semiconductor layer;
trenches extending from the upper surface of the semiconductor substrate to reach the third semiconductor layer through the first semiconductor region and the second semiconductor layer;
an insulating film covering an inner surface of each trench; and
a conductive material disposed inside each trench, and insulated from the semiconductor substrate by the corresponding insulating film,
in a plan view of the semiconductor substrate, the trenches provided in the first region have a first width, and the trenches provided in the second region have a second width that is narrower than the first width, and
outer edges of upper surfaces of the conductive material in the first region are positioned closer to a deep side of the semiconductor substrate than outer edges of upper surfaces of the conductive material in the second region are.

4. The semiconductor device according to claim 3, wherein
the first region includes a main region,
the second region includes a sense region,
a peak depth of an impurity concentration of the second conductivity type of the second semiconductor layer, in each of the first region and the second region, is distributed so as to shift toward the deep side of the semiconductor substrate with a closer distance to the corresponding trench, and
a shift amount of the peak depth in the first region is larger than a shift amount of the peak depth in the second region.

5. The semiconductor device according to claim 3, further comprising a cap insulating film formed on top of the conductive material disposed inside each trench.

6. The semiconductor device according to claim 5, wherein recesses are formed by the cap insulating film and each trench.

7. The semiconductor device according to claim 6, further comprising an interlayer insulating film formed on top of the cap insulating film in each trench to fill the respective recess.

8. A semiconductor device comprising a first region having a first threshold voltage and a second region having a second threshold voltage that is higher than the first threshold voltage, the first region and the second region being provided in a common semiconductor substrate, wherein
each of the first region and the second region comprises:
a first semiconductor region of a first conductivity type provided at a position exposed on an upper surface of the semiconductor substrate;
a second semiconductor layer of a second conductivity type provided on a deep side of the first semiconductor region, and being in contact with the first semiconductor region;
a third semiconductor layer of the first conductivity type provided on a deep side of the second semiconductor layer, and separated from the first semiconductor region by the second semiconductor layer;
trenches extending from the upper surface of the semiconductor substrate to reach the third semiconductor layer through the first semiconductor region and the second semiconductor layer;

an insulating film covering an inner surface of each trench; and a conductive material disposed inside each trench, and insulated from the semiconductor substrate by the corresponding insulating film, in a plan view of the semiconductor substrate, the trenches provided in the first region have a first width, and the trenches provided in the second region have a second width that is narrower than the first width, upper surfaces of the conductive material in the first region are positioned at a first positions and upper surfaces of the conductive material in the second region are positioned at a second positions, the first positions being closer to the deep side of the semiconductor substrate than the second positions, the first region includes a main region, the second region includes a sense region, a peak depth of an impurity concentration of the second conductivity type of the second semiconductor layer, in each of the first region and the second region, is distributed so as to shift toward the deep side of the semiconductor substrate with a closer distance to the corresponding trench, and a shift amount of the peak depth in the first region is larger than a shift amount of the peak depth in the second region.

* * * * *